United States Patent [19]
Endo et al.

[11] Patent Number: 5,756,262
[45] Date of Patent: May 26, 1998

[54] METHOD FOR FORMING PATTERN

[75] Inventors: Masayuki Endo; Akiko Katsuyama, both of Osaka, Japan

[73] Assignee: Matsushita Electric Industrial Co., Ltd., Osaka, Japan

[21] Appl. No.: 612,798

[22] Filed: Mar. 11, 1996

[30] Foreign Application Priority Data

Mar. 8, 1995 [JP] Japan ................................. 7-048449
Dec. 4, 1995 [JP] Japan ................................. 7-315052

[51] Int. Cl.$^6$ ................................................. G03C 5/00
[52] U.S. Cl. ................................... 430/313; 430/327
[58] Field of Search .................................. 430/313, 327

[56] References Cited

U.S. PATENT DOCUMENTS

| | | | |
|---|---|---|---|
| 4,704,348 | 11/1987 | Koizumi et al. | 430/327 |
| 4,857,435 | 8/1989 | Hopf et al. | 430/192 |
| 4,900,696 | 2/1990 | Ito et al. | 437/229 |
| 5,164,278 | 11/1992 | Brunsvold et al. | 430/176 |

FOREIGN PATENT DOCUMENTS 0 520 654   12/1992   European Pat. Off. .

OTHER PUBLICATIONS

O. Nalamasu et al., "Preliminary Lithographic Characteristics of an All-organic Chemically Amplified Resist Formulation for Single Layer Deep-UV Lithography", 1991, pp. 13–25, Proc. of SPIE vol. 1466 Advances in Resist Technology and Processing VIII (1991).

*Primary Examiner*—Mark Chapman
*Attorney, Agent, or Firm*—McDermott, Will & Emery

[57] ABSTRACT

The composition of a resist material is determined so that the film thinning quantity of the resist pattern is increased when the profile of a resist pattern which is formed in advance tends to be a T-top profile as compared with a reference pattern profile but so that the film thinning quantity of the resist pattern is decreased when the profile of the resist pattern which is formed in advance tends to be a round-shoulder profile as compared with the reference pattern profile. After coating a semiconductor substrate at its top with the resist material whose composition is determined as such to thereby form a resist film, the resist film is exposed through a mask. The exposed resist film is developed, whereby a resist pattern is obtained.

3 Claims, 13 Drawing Sheets

T-TOP PROFILE

ROUND-SHOULDER PROFILE

EXCELLENT PROFILE

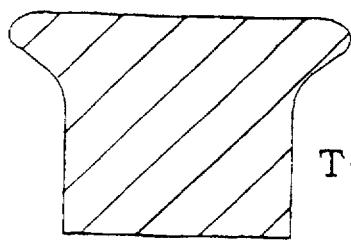
FIG. 3A    T-TOP PROFILE
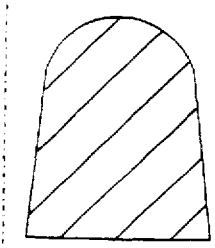
FIG. 3B    ROUND-SHOULDER PROFILE
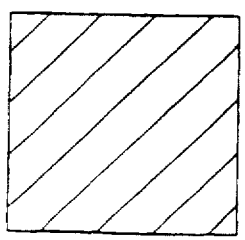
FIG. 3C    EXCELLENT PROFILE
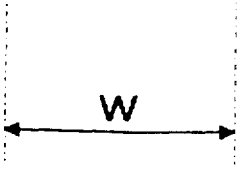

F IG. 11
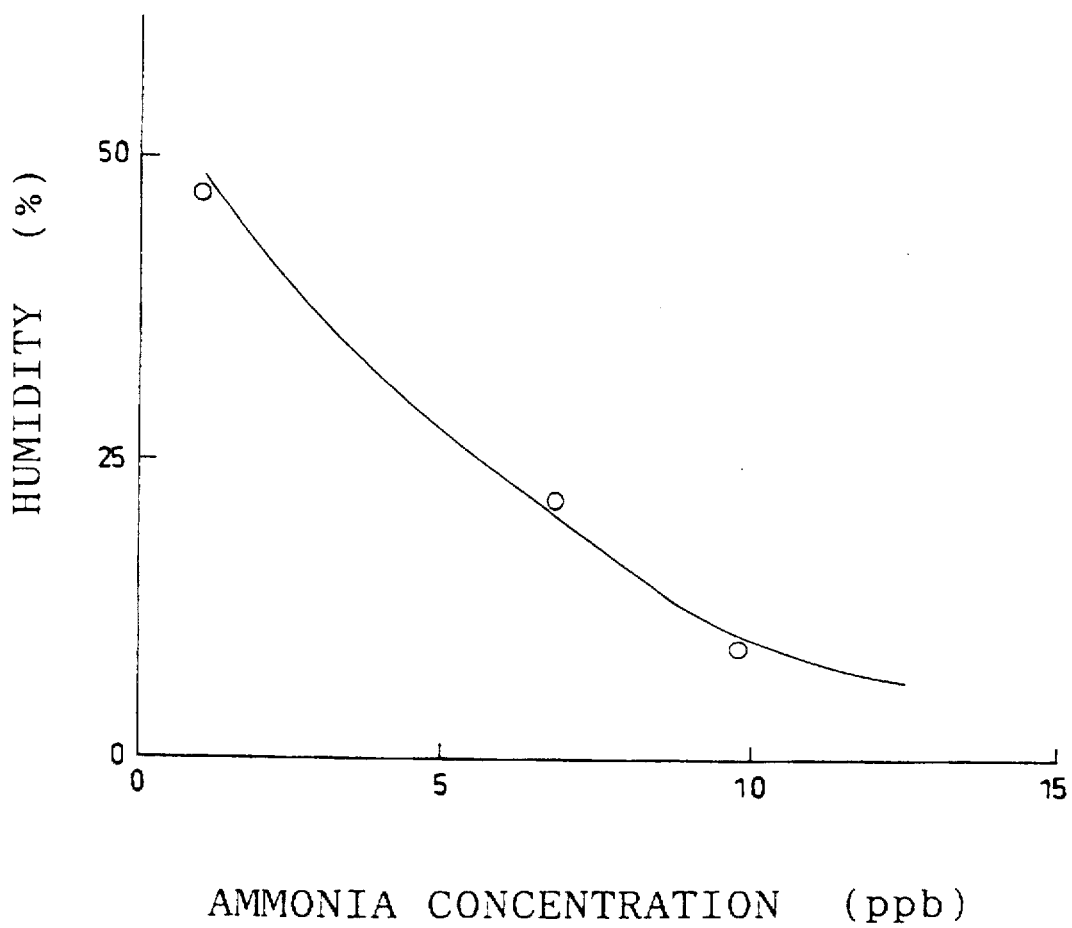

METHOD FOR FORMING PATTERN

BACKGROUND OF THE INVENTION

The present invention relates to a method for forming a fine pattern during manufacturing of a semiconductor.

A method using a chemically amplified resist utilizing chemical amplification which is created by generation of acid is known as a conventional method of forming a pattern, as disclosed by O. Nalamasu et al., Proc. of SPIE, vol. 1466, p. 238 (1991).

In the following, a conventional pattern forming method will be described with reference to FIGS. 13A to 13D.

First, a 2-component material as follows is prepared as a resist material:

| | |
|---|---|
| Resin which is made alkali-soluble by acid ... poly (tert-butyloxycarbonyloxystyrene) (32.5 mol %) - hydroxystyrene 67.5 mol %) | 10 g |
| Compound which generates acid when under an energy ray (acid generating agent) ... triphenylsulfoniumtriflate | 0.5 g |
| Solvent ... diethyleneglycol dimethylether | 45 g |

Next, as shown in FIG. 13A, a semiconductor substrate 1 is coated at its top with the 2-component type resist, and a resist film 2 is formed which has a thickness of 1 μm. Following this, as shown in FIG. 13B, within a cleanroom under a normal condition (ammonia concentration: 15 ppb, humidity: 45%), exposing 4 is performed at 25 mJ/cm$^2$ on the resist film 2 through a mask 3, using an KrF excimer laser stepper (NA: 0.42).

Next, as shown in FIG. 13C, after performing heating 5 for 90 seconds on the semiconductor substrate 1 at a temperature of 95° C, the resist film 2 is developed for 60 seconds in an alkaline solution of 2.38 wt %, whereby a resist pattern 6 of a positive type is defined as shown in FIG. 13D.

The conventional pattern forming step as above causes the following phenomena on an exposed portion of the resist film 2. That is, a tert-butyloxycarbonyl group included in the resin which is made alkali-soluble by acid which is generated by an acid generating agent during exposing is severed from the resin to thereby cause reaction in which the resin becomes alkali-soluble, and this reaction is promoted during heating and reaches to a bottom portion of the resist film 2. If the resist film 2 is then developed in an alkaline solution, the exposed portion of the resist film 2 dissolves so that the resist pattern 6 of a positive type is obtained.

When a 3-component material as follows is used instead of the 2-component material as above, because of a similar phenomena, a resist pattern of a positive type is formed:

| | |
|---|---|
| Alkali-soluble resin ... poly (vinylphenol) | 10 g |
| Compound which prevents alkaline dissolution of an alkali-soluble resin and which is made alkali-soluble by acid ... tert-butyloxycarbonyloxybisphenol A | 1.5 g |
| Compound which generates acid when under an energy ray (acid generating agent) ... triphenylsulfoniumtriflate | 0.5 g |
| Solvent ... diethyleneglycol dimethylether | 50 g |

This is true with a case where the following commercially available resist materials are used instead of the resist materials as above: APEX-E (Shipley), DX46 (Hoechst), WKR-PT-2 (Wako Pure Chemical), CAMP6 (OCG), ARCH (Fuji Hunt), DP009 (Tokyo Ohka), KRF K2G (Japan Synthetic Rubber) or SEPR (Shin-Etsu Chemical).

However, in the resist pattern 6 which is formed using either one of the resist materials above, acid which is generated by the acid generating agent is deactivated due to an influence of an impurity, such as an amine-contained compound, which is included in an atmosphere, thereby often deteriorating the profile of the resist pattern 6 and hence the resolution of a pattern as shown in FIG. 13D. In short, acid which is generated by the acid generating agent is deactivated due to an impurity, such as ammonia, which usually exists within the cleanroom, and an upper portion of the resist pattern 6 does not become alkali-soluble, whereby an upper portion of the exposed portion of the resist pattern 6 remains even after developed in an alkaline solution.

When etching is performed on a film to be etched, using such a resist pattern having a deteriorated profile, the etched profile of the film to be etched becomes defective and hence a device becomes defective. This deteriorates a yield.

As described above, in addition to ammonia, amine, a substance containing a sulfuric acid ion or an nitric acid ion, etc., are also impurities which deactivate acid which is generated by an acid generating agent.

SUMMARY OF THE INVENTION

Considering the above, the present invention aims to prevent deactivation of acid which is generated by an acid generating agent so that a resist pattern having an excellent profile is obtained.

The present invention has been made based on discovery that it is possible to control the profile of a resist pattern by altering the composition of a resist or by changing the humidity in an environment in which the resist pattern is formed.

A first pattern forming method according to the present invention comprises: a first step of determining the composition of a resist so that a film thinning quantity of a resist pattern increases when the profile of the resist pattern tends to be a T-top profile as compared with a reference pattern profile but so that the film thinning quantity of the resist pattern decreases when the profile of the resist pattern tends to be a round-shoulder profile as compared with the reference pattern profile; a second step of forming a resist film by coating a substrate with the resist whose composition is determined in a manner above; a third step of exposing the resist film through a mask; and a fourth step of developing the exposed resist film to thereby form a resist pattern.

According to the first pattern forming method, if the composition of the resist is determined so that the film thinning quantity of the resist pattern increases when the profile of the resist pattern tends to be a T-top profile as compared with the reference pattern profile, the T-top tendency of the resist pattern is offset by an increase in the film thinning quantity of the resist pattern. Conversely, when the profile of the resist pattern tends to be a round-shoulder profile as compared with the reference pattern profile, if the composition of the resist is determined so that the film thinning quantity of the resist pattern decreases, the round-shoulder tendency of the resist pattern is offset by a decrease in the film thinning quantity of the resist pattern. Since it is possible to form a resist pattern with a desirable profile and an excellent resolution in this manner, it is possible to improve a yield of manufacturing devices.

In the first pattern forming method, the resist is a chemically amplified resist which includes an acid generating agent which generates acid when irradiated with an energy ray and a resin which is made alkali-soluble by acid, and the first step includes a step of changing a copolymerization ratio of the resin which is made alkali-soluble by acid to thereby increase or decrease the film thinning quantity of the resist pattern.

In such a method, it is possible to steadily offset the T-top tendency of the resist pattern by an increase in the film thinning quantity of the resist pattern or to steadily offset the round-shoulder tendency of the resist pattern by a decrease in the film thinning quantity of the resist pattern.

Alternatively, in the first pattern forming method, the resist is a chemically amplified resist which includes an acid generating agent which generates acid when irradiated with an energy ray, an alkali-soluble resin, and a compound which prevents alkaline dissolution of the alkali-soluble resin and which is made alkali-soluble by acid, and the first step includes a step of changing a ratio of the compound to the alkali-soluble resin to thereby increase or decrease the film thinning quantity of the resist pattern.

In such a method, it is possible to steadily offset the T-top tendency of the resist pattern by an increase in the film thinning quantity of the resist pattern or to steadily offset the round-shoulder tendency of the resist pattern by a decrease in the film thinning quantity of the resist pattern.

A second pattern forming method according to the present invention comprises: a first step of setting the humidity in an environment for forming a resist pattern at a low level when the profile of the resist pattern tends to be a T-top profile as compared with a reference pattern profile but setting the humidity at a high level when the profile of a resist pattern tends to be a round-shoulder profile as compared with the reference pattern profile; a second step of forming a resist film by coating a substrate with a resist; a third step of exposing the resist film through a mask in an environment with the humidity set at the first step; and a fourth step of developing the exposed resist film to thereby form a resist pattern.

According to the second pattern forming method, if the humidity in the environment for forming a resist pattern is set at a low level when the profile of the resist pattern tends to be a T-top profile as compared with the reference pattern profile, since vapor which includes an impurity is prevented from reaching a surface of the resist film at which acid is generated and therefore deactivation of acid which is generated by the acid generating agent is suppressed, the T-top tendency of the resist pattern is eliminated. Conversely, if the humidity in the environment for forming a resist pattern is set at a high level when the profile of the resist pattern tends to be a round-shoulder profile as compared with the reference pattern profile, since vapor which includes an impurity is prevented from reaching a surface of the resist film at which acid is generated and therefore deactivation of acid which is generated by the acid generating agent is promoted, the round-shoulder tendency of the resist pattern is eliminated. This allows to form a resist pattern with a desirable profile and an excellent resolution, and therefore, it is possible to improve a yield of manufacturing devices.

A third pattern forming method according to the present invention comprises: a first step of determining the composition of a resist so that a film thinning quantity of a resist pattern increases when the concentration of an impurity within an environment for forming a resist pattern is larger than a predetermined value but so that the film thinning quantity of the resist pattern decreases when the concentration of the impurity within the environment for forming a resist pattern is smaller than the predetermined value; a second step of forming a resist film by coating a substrate with the resist whose composition is determined in a manner above; a third step of exposing the resist film through a mask; and a fourth step of developing the exposed resist film to thereby form a resist pattern.

According to the third pattern forming method, if the composition of the resist is determined so that the film thinning quantity of the resist pattern increases when the concentration of the impurity within the environment for forming a resist pattern is larger than the predetermined value, the tendency of the resist pattern to become T-top shaped since the impurity concentration within the environment for forming a resist pattern is large is offset by an increase in the film thinning quantity of the resist pattern. Conversely, when the concentration of the impurity within the environment for forming a resist pattern is smaller than the predetermined value, if the composition of the resist is determined so that the film thinning quantity of the resist pattern decreases, the tendency of the resist pattern to become round-shoulder shaped since the impurity concentration within the environment for forming a resist pattern is small is offset by a decrease in the film thinning quantity of the resist pattern. Thus, it is possible to form a resist pattern with a desirable profile and an excellent resolution in this manner, and therefore, it is possible to improve a yield of manufacturing devices.

In the third pattern forming method, the resist is a chemically amplified resist which includes an acid generating agent which generates acid when irradiated with an energy ray and a resin which is made alkali-soluble by acid, and the first step includes a step of changing a copolymerization ratio of the resin which is made alkali-soluble by acid to thereby increase or decrease the film thinning quantity of the resist pattern.

In such a method, it is possible to steadily offset the T-top tendency of the resist pattern by an increase in the film thinning quantity of the resist pattern or to steadily offset the round-shoulder tendency of the resist pattern by a decrease in the film thinning quantity of the resist pattern.

Alternatively, in the third pattern forming method, the resist is a chemically amplified resist which includes an acid generating agent which generates acid when irradiated with an energy ray, an alkali-soluble resin, and a compound which prevents alkaline dissolution of the alkali-soluble resin and which is made alkali-soluble by acid, and the first step includes a step of changing a ratio of the compound to the alkali-soluble resin to thereby increase or decrease the film thinning quantity of the resist pattern.

In such a method, it is possible to steadily offset the T-top tendency of the resist pattern by an increase in the film thinning quantity of the resist pattern or to steadily offset the round-shoulder tendency of the resist pattern by a decrease in the film thinning quantity of the resist pattern.

Alternatively, in the third pattern forming method, the resist is a chemically amplified resist of a 2-component type or a 3-component type which includes an acid generating agent which generates acid when irradiated with an energy ray and a compound which is made alkali-soluble by acid, and the impurity is ammonia.

In such a method, it is possible to suppress ammonia-induced deactivation of acid which is generated by the acid generating agent when a chemically amplified resist is used.

A fourth pattern forming method according to the present invention comprises: a first step of setting the humidity in an environment for forming a resist pattern at a low level when an impurity concentration within the environment for forming a resist pattern is larger than a predetermined value but setting the humidity at a high level when the impurity concentration within the environment for forming a resist pattern is smaller than the predetermined value; a second step of forming a resist film by coating a substrate with a resist; a third step of exposing the resist film through a mask within the environment with the humidity set at the first step; and a fourth step of developing the exposed resist film to thereby form the resist pattern.

According to the fourth pattern forming method, if the humidity in the environment for forming a resist pattern is set at a low level when the impurity concentration within the environment for forming the resist pattern is larger than the predetermined value, since vapor which includes an impurity is prevented from reaching a surface of the resist film at which acid is generated and therefore deactivation of acid which is generated by the acid generating agent is suppressed, the tendency of the resist pattern to become T-top shaped due to the large impurity concentration is suppressed. Conversely, if the humidity in the environment for forming a resist pattern is set at a high level when the impurity concentration within the environment for forming the resist pattern is smaller than the predetermined value, since vapor which includes an impurity is prevented from reaching a surface of the resist film at which acid is generated and therefore deactivation of acid which is generated by the acid generating agent is promoted, the tendency of the resist pattern to become round-shoulder due to the small impurity concentration shaped is suppressed. This allows to form a resist pattern with a desirable profile and an excellent resolution, and therefore, it is possible to improve a yield of manufacturing devices.

In the fourth pattern forming method, the resist is a chemically amplified resist of a 2-component type or a 3-component type which includes an acid generating agent which generates acid when irradiated with an energy ray and a compound which is made alkali-soluble by acid, and the impurity is ammonia.

In such a method, it is possible to suppress ammonia-induced deactivation of acid which is generated by the acid generating agent when a chemically amplified resist is used.

BRIEF DESCRIPTION OF THE DRAWINGS

FIGS. 3A to 3C are cross sectional views for describing the profile of a resist pattern in the pattern forming methods according to the first and the second preferred embodiments;

FIG. 11 is a characteristic diagram showing a correlation between an impurity concentration within an environment which produces an excellent pattern profile and the humidity within the environment, in a third example of the pattern forming method according to the second preferred embodiment;

DESCRIPTION OF THE PREFERRED EMBODIMENTS

<First Preferred Embodiment>

In the following, a pattern forming method according to a first preferred embodiment of the present invention will be described.

FIG. 3A shows a cross sectional profile of a resist pattern which becomes T-top shaped due to a small film thinning quantity of the resist pattern. FIG. 3B shows a case where the resist pattern which becomes round-shoulder shaped due to a large film thinning quantity of the resist pattern. FIG. 3C shows a case where the resist pattern has an excellent profile since the film thinning quantity of the resist pattern is appropriate.

Figure 4:
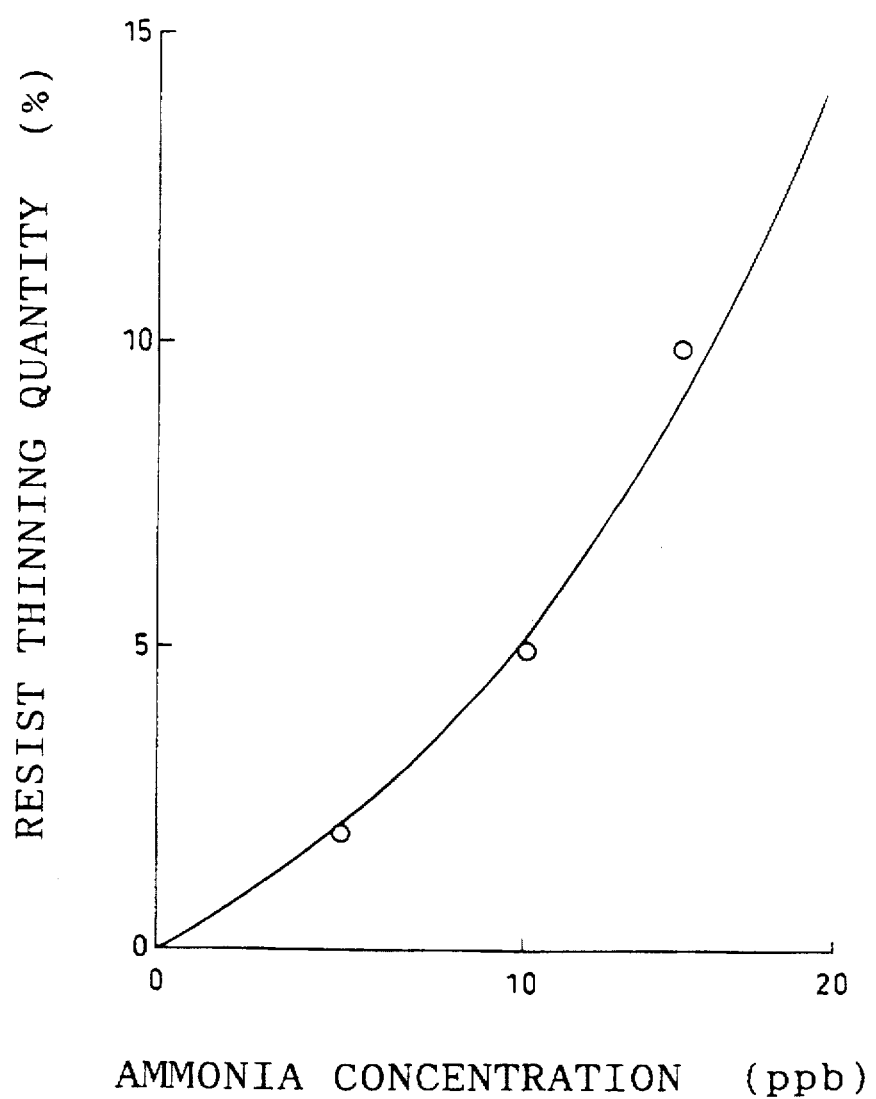
FIG. 4 is a characteristic diagram showing a first correlation between an impurity concentration within an environment which produces an excellent pattern profile and the film thinning quantity of a resist pattern, in the pattern forming method according to the first preferred embodiment.

First, a first correlation is identified between the concentration of an impurity within an environment which produces an excellent pattern profile and the film thinning quantity of the resist pattern. FIG. 4 shows a result of an experiment for identifying the first correlation between the concentration of ammonia (ppb) within a cleanroom in which it is possible to obtain an excellent pattern profile and the film thinning quantity (%) of the resist pattern. In this experiment, a resist pattern profile varying within a range of ±10% is defined as an excellent pattern profile which includes no T-top shape or no round-shoulder shape.

Next, a second correlation is identified between the film thinning quantity of the resist pattern and the composition of a resist material. A method of identifying the second correlation will be described in detail later, since the method of identifying the second correlation is closely related to the composition of a resist material.

Following this, the concentration of an impurity within the environment, e.g., the concentration of ammonia (ppb) within a cleanroom, is measured by a chemiluminescent method, to thereby determine an appropriate film thinning quantity which corresponds to a measured ammonia concentration from the first correlation shown in FIG. 4.

Instead of determining the appropriate film thinning quantity which corresponds to a measured ammonia concentration from the first correlation, the film thinning quantity of the resist pattern may be increased when the concentration of the impurity within the environment for forming the resist pattern is larger than a predetermined value but may be decreased when the concentration of the impurity within the environment for forming the resist pattern is smaller than the predetermined value.

Alternatively, the film thinning quantity of the resist pattern may be increased when the profile of a resist pattern which is formed in advance tends to be a T-top profile as compared with a reference pattern profile but may be decreased when the profile of the resist pattern which is formed in advance tends to have a round-shoulder profile as compared with the reference pattern profile.

Next, from the second correlation the described above, the composition of a resist material corresponding to the appropriate film thinning quantity is found, and a resist material which has such a composition is prepared.

Figure 1A:
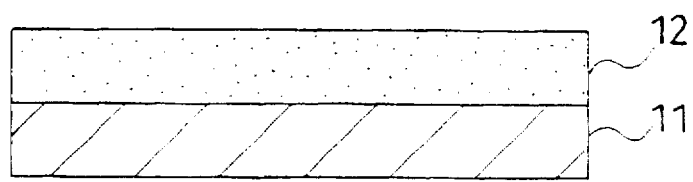
FIGS. 1A to 1D are cross sectional views for describing the respective steps of a pattern forming method according to a first preferred embodiment of the present invention.
Figure 1B:
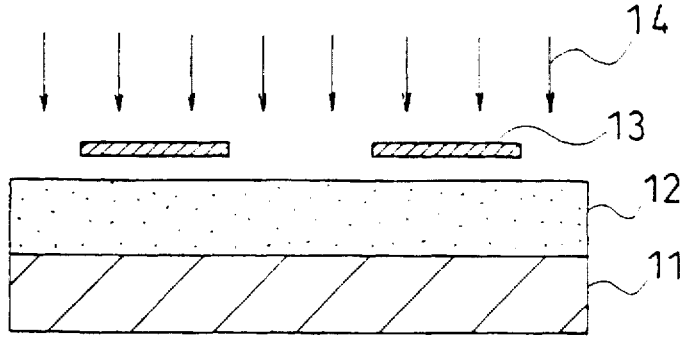

Following this, as shown in FIG. 1A, a semiconductor substrate 11 is coated at its top with the resist material as above, and a resist film 12 having a thickness of 1 µm is formed. Exposing 14 is then performed at 25 mJ/cm² on the resist film 12 through a mask 13 within the cleanroom as described above, using an KrF excimer laser stepper (NA: 0.42), as shown in FIG. 1B.

Figure 1C:
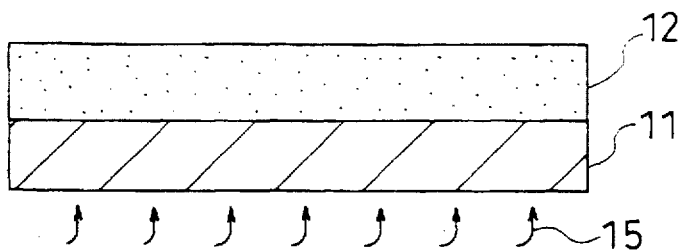
Figure 1D:
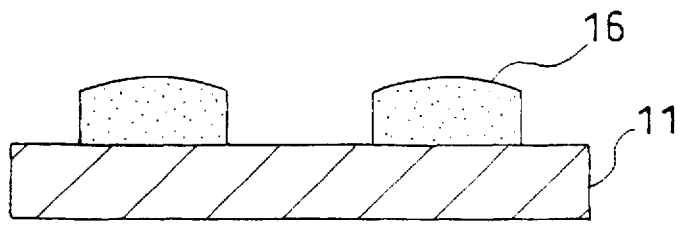

Next, as shown in FIG. 1C, after performing heating 15 for 90 seconds on the semiconductor substrate 11 at a temperature of 95° C. the resist film 12 is developed for 60 seconds in an alkaline solution of 2.38 wt %, whereby a resist pattern 16 of a positive type is defined as shown in FIG. 1D (design rule: 0.25 µm).

In the pattern forming method according to the first preferred embodiment, acid which is generated by the acid generating agent is deactivated under an influence of the impurity within the cleanroom, namely, ammonia. Although the resist pattern 16 therefore tends to have a T-top profile as shown in FIG. 3A, since an upper portion of the resist pattern 16 is removed due to thinning of the resist pattern during developing, that is, since the tendency of the resist pattern 16 to become T-top shaped is offset by the film thinning quantity of the resist pattern, the resist pattern 16 is completed as having an excellent profile with a vertical cross section to the substrate as shown in FIG. 3C. If the influence of ammonia, i.e., the impurity within the cleanroom, is small, the film thinning quantity of the resist pattern 16 is to be reduced.

Thus, the film thinning quantity of the resist pattern 16 is increased or decreased to determine the composition of the resist material so that the film thinning quantity of the resist pattern 16 becomes appropriate, depending on whether the concentration of the impurity within the environment for forming the resist pattern 16 is large or small, or depending on whether the resist pattern 16 which is formed in advance tends to have a T-top profile or a round-shoulder profile. Hence, it is possible to form the resist pattern 16 having an excellent profile.

Now, a description will be given on a method for determining the composition of the resist material so that the film thinning quantity of the resist pattern 16 becomes a desired value according to the first preferred embodiment, while citing examples.

<First Example>

A first example is a case where the resin which is made alkali-soluble by acid is a first resist material of a 2-component type which uses a copolymer consisting of poly (tert-butyloxycarbonyloxystyrene-hydroxystyrene).

Figure 5:
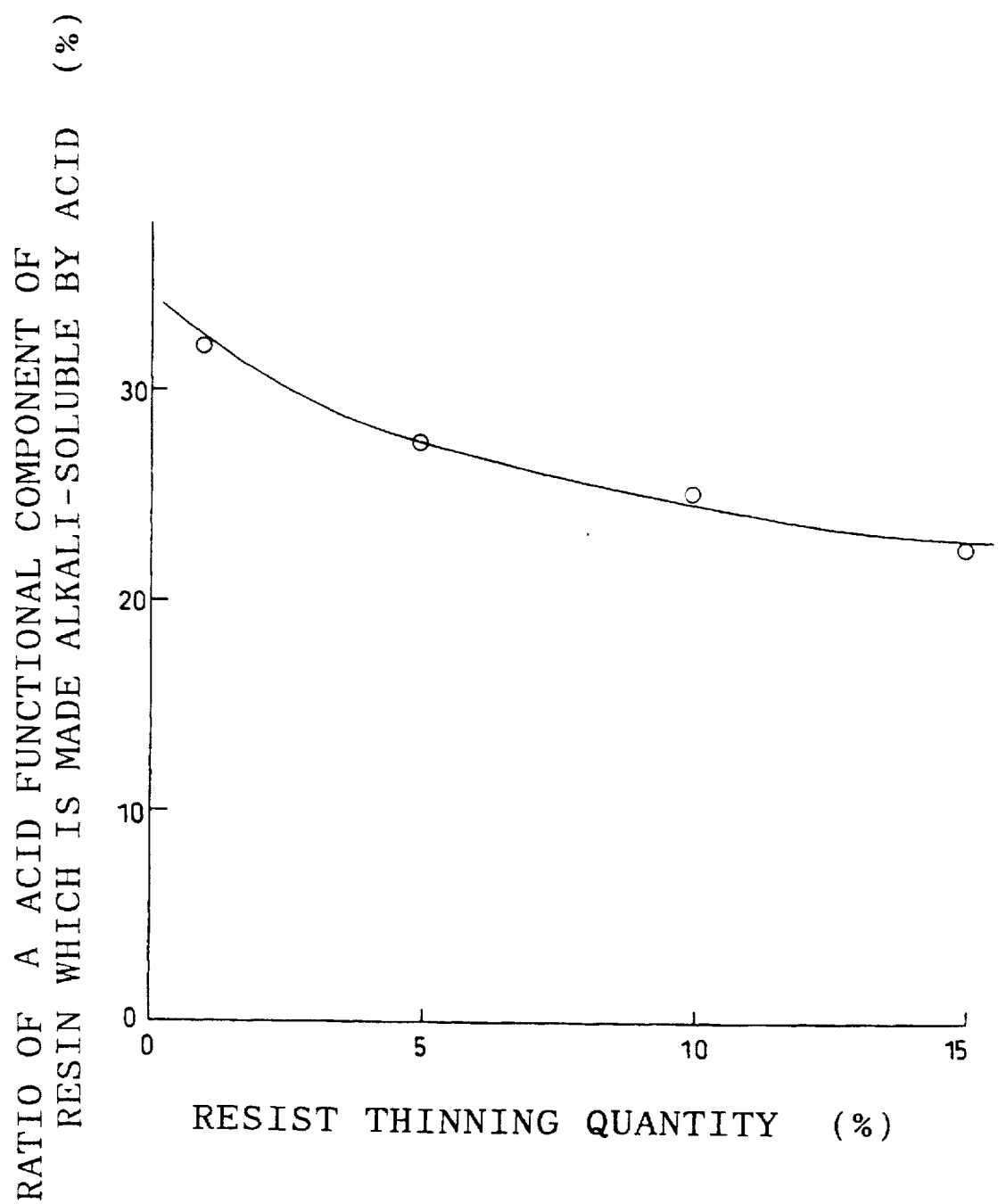
FIG. 5 is a characteristic diagram showing a second correlation between the film thinning quantity of a resist pattern and a ratio of an acid functional component of a resin which is made alkali-soluble by acid, in a first example of the pattern forming method according to the first preferred embodiment.

First, as shown in FIG. 5, the second correlation is found between the film thinning quantity (%) of the resist pattern and a ratio (%) of an acid functional component of the resin, which is made alkali-soluble by acid, within the 2-component type first resist material.

Next, $NH_3$ within the cleanroom (humidity 45%) is measured by a chemiluminescent method. Since $NH_3$ is 15 ppb, the copolymerization ratio of the resin which is made alkali-soluble by acid is set so as to ensure 10% of the film thinning quantity of the resist pattern (conventionally 1%) as described below:

| | |
|---|---|
| Resin which is made alkali-soluble by acid . . . poly (tert-butyloxycarbonyloxystyrene) (25 mol %) - hydroxystyrene (75 mol %) | 10 g |
| Compound which generates acid when under an energy ray (acid generating agent) . . . triphenylsulfoniumtriflate | 0.5 g |
| Solvent . . . diethyleneglycol dimethylether | 45 g |

<Second Example>

A second example is a case where the resin which is made alkali-soluble by acid is a second resist material of a 2-component type which uses a copolymer consisting of poly ((1-ethoxy)ethoxystyrene)-hydroxystyrene.

Figure 6:
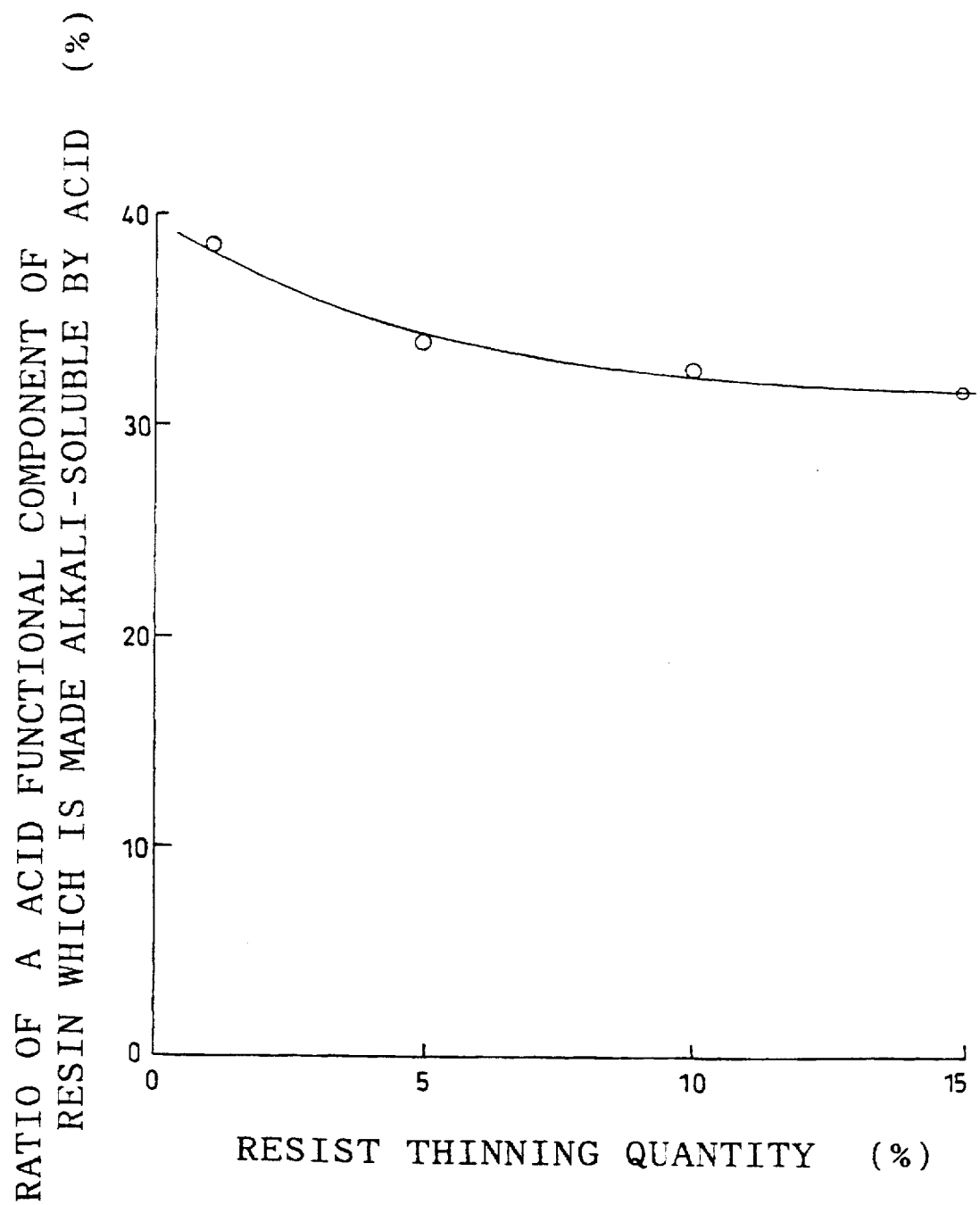
FIG. 6 is a characteristic diagram showing the second correlation between the film thinning quantity of a resist pattern and a ratio of an acid functional component of a resin which is made alkali-soluble by acid, in a second example of the pattern forming method according to the first preferred embodiment.

First, as shown in FIG. 6, the second correlation is found between the film thinning quantity (%) of the resist pattern and a ratio (%) of an acid functional component of the resin, which is made alkali-soluble by acid, within the 2-component type second resist material.

Next, if $NH_3$ within the cleanroom (humidity 45%) is 15 ppb, the copolymerization ratio of the resin which is made alkali-soluble by acid is set so as to ensure 10% of the film thinning quantity of the resist pattern as described below:

| | |
|---|---|
| Resin which is made alkali-soluble by acid . . . poly ((1-ethoxy)ethoxystyrene) (32.5 mol %) - hydroxystyrene (67.5 mol %) | 10 g |
| Compound which generates acid when under an energy ray (acid generating agent) . . . 2, 6-dinitrobenzyltosylate | 0.5 g |
| Solvent . . . propyleneglycol monomethyletheracetate | 45 g |

<Third Example>

A third example is a case where the first resist material of a 3-component type is used, which includes poly (vinylphenol) which serves as an alkali-soluble resin and tert-butyloxycarbonyloxybisphenol A which serves as a compound which prevents alkaline dissolution of the alkali-soluble resin and which is made alkali-soluble by acid.

Figure 7:
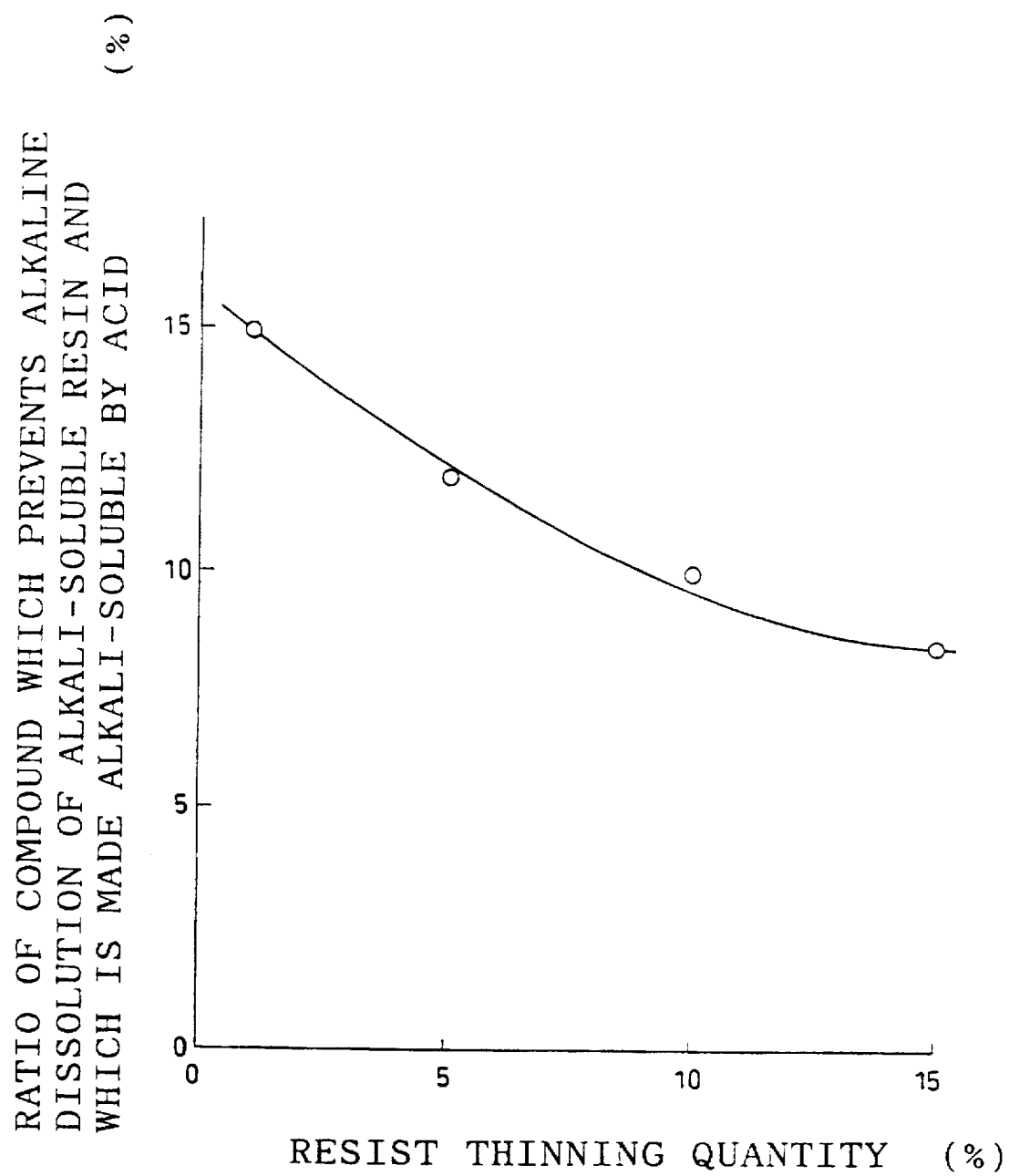
FIG. 7 is a characteristic diagram showing the second correlation between the film thinning quantity of a resist pattern and a copolymerization ratio of a resin which prevents alkaline dissolution of the alkali-soluble resin and which is made alkali-soluble by acid, in a third example of the pattern forming method according to the first preferred embodiment.

First, as shown in FIG. 7, the second correlation is found between the film thinning quantity (%) of the resist pattern and a ratio (wt %) of the compound, which prevents alkaline dissolution of the alkali-soluble resin and is made alkali-soluble by acid, within the 3-component type resist material.

Next, if $NH_3$ within the cleanroom (humidity 45%) is 15 ppb, the copolymerization ratio of the compound, which prevents alkaline dissolution of the alkali-soluble resin and is made alkali-soluble by acid, within the 3-component type first resist material, is set so as to ensure 10% of the film thinning quantity of the resist pattern as described below:

| | |
|---|---|
| Alkali-soluble resin . . . poly (vinylphenol) | 10 g |
| Compound which prevents alkaline dissolution of an alkali-soluble resin and which is made alkali-soluble by acid . . . tert-butyloxycarbonyloxybisphenol A | 1.0 g |
| Compound which generates acid when under an energy ray (acid generating agent) . . . triphenylsulfoniumtriflate | 0.5 g |
| Solvent . . . diethyleneglycol dimethylether | 50 g |

<Fourth Example>

A fourth example is a case where the second resist material of a 3-component type is used, which includes poly (vinylphenol) which serves as an alkali-soluble resin and (1-ethoxy) ethoxybisphenol A which serves as a compound which prevents alkaline dissolution of the alkali-soluble resin and which is made alkali-soluble by acid.

Figure 8:
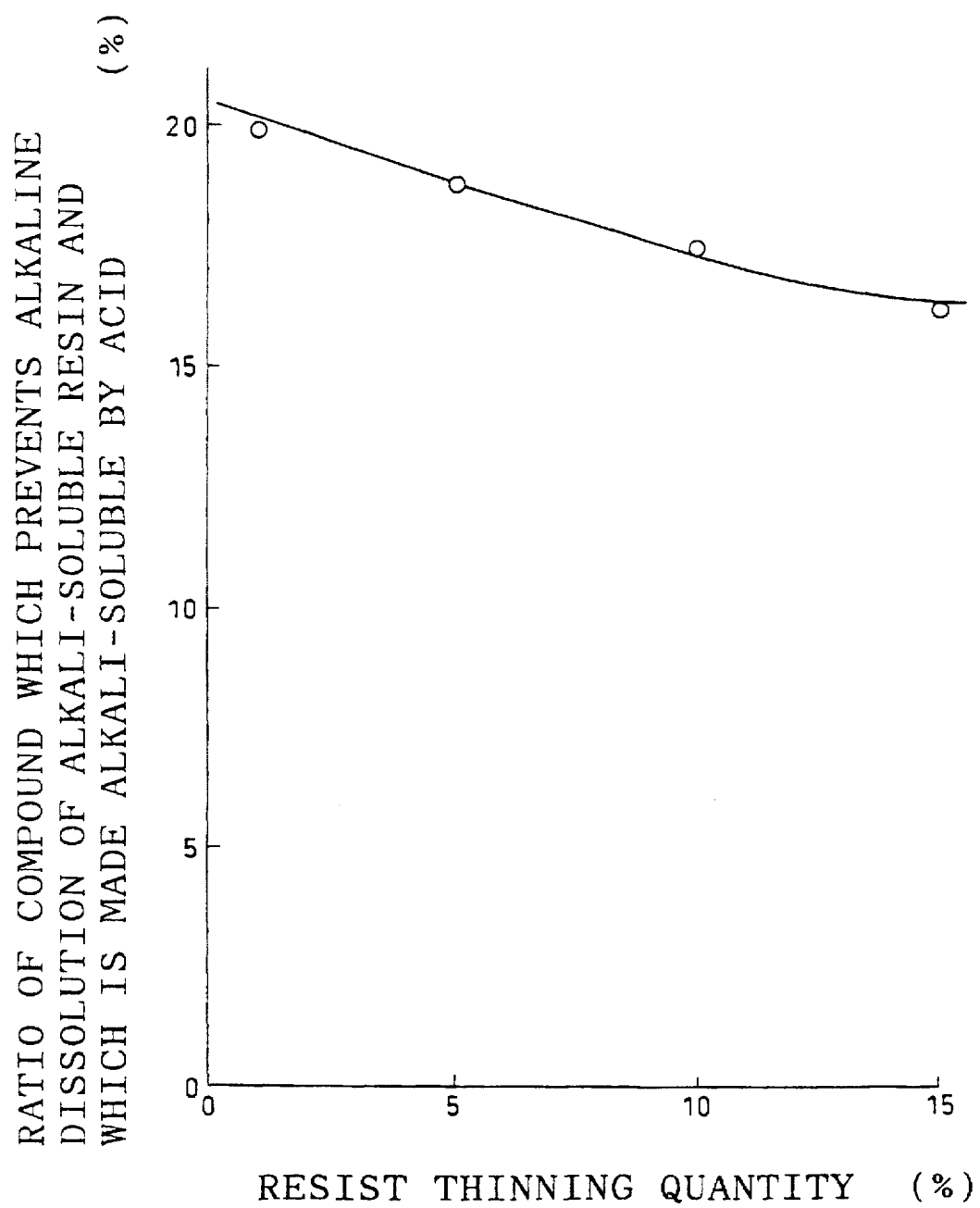
FIG. 8 is a characteristic diagram showing the second correlation between the film thinning quantity of a resist pattern and a copolymerization ratio of a resin which prevents alkaline dissolution of the alkali-soluble resin and which is made alkali-soluble by acid, in a fourth example of the pattern forming method according to the first preferred embodiment.

First, as shown in FIG. 8, the second correlation is found between the film thinning quantity (%) of the resist pattern and a ratio (wt %) of the compound, which prevents alkaline dissolution of the alkali-soluble resin and is made alkali-soluble by acid, within the 3-component type resist material.

Next, if $NH_{1_3}$ within the cleanroom (humidity 45%) is 15 ppb, the copolymerization ratio of the compound, which prevents alkaline dissolution of the alkali-soluble resin and is made alkali-soluble by acid, within the 3-component type second resist material, is set so as to ensure 10% of the film thinning quantity of the resist pattern as described below:

| | |
|---|---|
| Alkali-soluble resin poly (vinylphenol) | 10 g |
| Compound which prevents alkaline dissolution of an alkali-soluble resin and which is made alkali-soluble by acid . . . (1-ethoxy)ethoxybisphenol A | 1.75 g |
| Compound which generates acid when under an energy ray (acid generating agent) . . . 2, 6-dinitrobenzyltosylate | 0.5 g |
| Solvent . . . propyleneglycol monomethyletheracetate | 50 g |

<Second Preferred Embodiment>

In the following, a pattern forming method according to a second preferred embodiment of the present invention will be described.

First, through an experiment, a correlation is found between the impurity concentration within an environment which produces an excellent pattern profile and the humidity within the environment. In this case as well, a resist pattern profile varying within a range of ±10% is defined as an excellent pattern profile which includes no T-top shape or no round-shoulder shape. The correlation between the impurity concentration and the humidity is closely related to a resist material, and therefore, a detailed description will be given thereon later.

Next, the concentration of the impurity within the environment, e.g., the concentration of ammonia (ppb) within a cleanroom, is measured by a chemiluminescent method, to thereby determine an appropriate humidity which corresponds to a measured ammonia concentration.

Figure 2A:
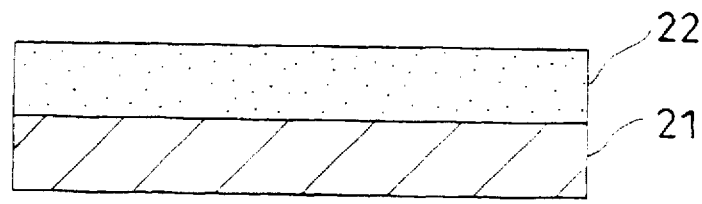
FIGS. 2A to 2D are cross sectional views for describing the respective steps of a pattern forming method according to a second preferred embodiment of the present invention.
Figure 2B:
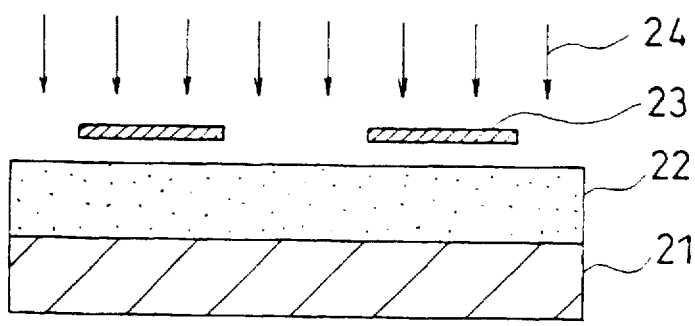

Following this, the humidity within the cleanroom is set at the appropriate humidity. After coating a semiconductor substrate 21 on its top with the resist material to thereby form a resist film 22 having a thickness of 1 µm as shown in FIG. 2A, exposing 24 is then performed at 25 mJ/cm² on the resist film 22 through a mask 23, using an KrF excimer laser stepper (NA: 0.42), as shown in FIG. 2B.

Figure 2C:
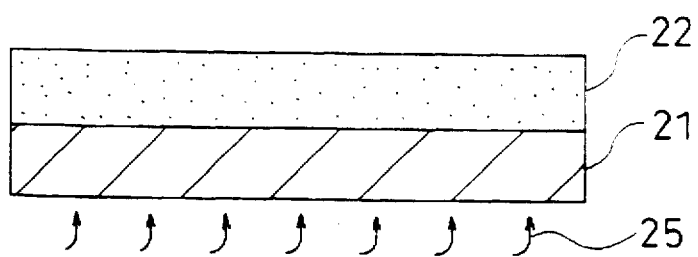
Figure 2D:
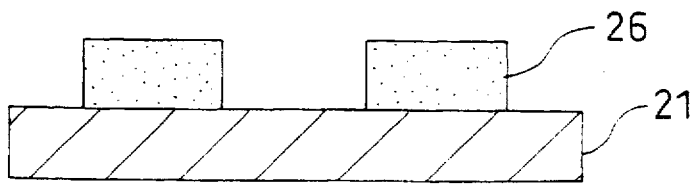

Next, as shown in FIG. 2C, after performing heating 25 for 90 seconds on the semiconductor substrate 21 at a temperature of 95° C. the resist film 22 is developed for 60 seconds in an alkaline solution of 2.38 wt %, whereby a resist pattern 26 of a positive type is defined as shown in FIG. 2D (design rule: 0.25 µm).

In the pattern forming method according to the second preferred embodiment, since the humidity within the cleanroom is set at an appropriate humidity (i.e., a low humidity) in accordance with the concentration of ammonia within the cleanroom, vapor which contains ammonia is prevented from reaching a surface of the resist film at which acid is generated, in other words, since the quantity of vapor which serves as a carrier for transferring ammonia is reduced, deactivation of acid which is generated by an acid generating agent is suppressed. Although vapor also functions to deactivate acid which is generated by the acid generating agent, this causes no problem since the acid deactivating effect of vapor is remarkably smaller than the acid deactivating effect of ammonia. Thus, the humidity within the cleanroom is set at an appropriate value, and therefore, the effect of ammonia within the cleanroom to influence acid which is generated by the acid generating agent is reduced, whereby the resist pattern 26 is completed as having an excellent profile with a vertical cross section to the substrate.

Instead of determining the appropriate humidity which corresponds to a measured ammonia concentration from the correlation above, the humidity within the environment for forming the resist pattern 26 may be set at a low value when the concentration of the impurity within the environment for forming the resist pattern 26 is larger than a predetermined value and may be set at a high value when the impurity concentration within the environment for forming the resist pattern 26 is smaller than the predetermined value.

Further, instead of setting the humidity in accordance with the concentration of the impurity within the environment for forming the resist pattern 26, the humidity within the environment for forming the resist pattern 26 may be set at a low value when the profile of a resist pattern which is formed in advance tends to be a T-top profile as compared with a reference pattern profile and may be set at a high value when the profile of the resist pattern which is formed in advance tends to be a round-shoulder profile as compared with the reference pattern profile.

As described above, in the second preferred embodiment, the humidity within the cleanroom is decreased or increased in accordance with whether the quantity of the impurity within the environment for forming the resist pattern 26 is large or small, or in accordance with whether the resist pattern 26 which is formed in advance tends to have a T-top profile or a round-shoulder profile. Hence, it is possible to form the resist pattern 26 having an excellent profile.

Further, while the second preferred embodiment requires to control the humidity within the cleanroom, the humidity within an environment for forming a resist pattern may be locally controlled, such as within an exposing apparatus, a resist coating apparatus and a resist developing apparatus.

Now, a description will be given on examples for realizing the second preferred embodiment.

<First Example>

A first example is a case where a first resist material of a 2-component type which consists of the following is used:

| | |
|---|---|
| Resin which is made alkali-soluble by acid . . . poly (tert-butyloxycarbonyloxystyrene) (30 mol %) - hydroxystyrene (70 mol %) | 10 g |
| Compound which generates acid when under an energy ray (acid generating agent) . . . triphenylsulfoniumtriflate | 0.5 g |
| Solvent . . . diethyleneglycol dimethylether | 45 g |

Figure 9:
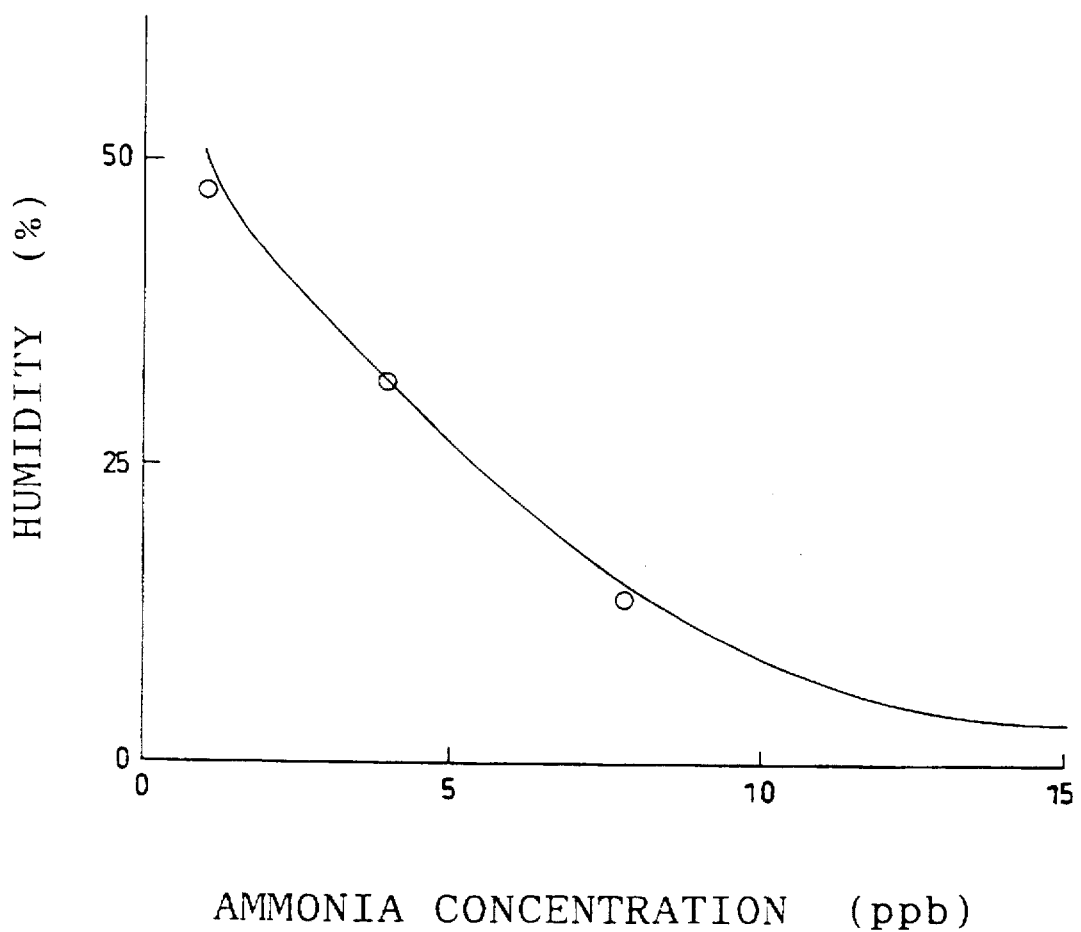
FIG. 9 is a characteristic diagram showing a correlation between an impurity concentration within an environment which produces an excellent pattern profile and the humidity within the environment, in a first example of the pattern forming method according to the second preferred embodiment.

First, as shown in FIG. 9, a correlation is found between the concentration of ammonia (ppb) and a humidity at which a resist pattern having an excellent profile can be formed.

Next, NH$_3$ within a cleanroom is measured by a chemiluminescent method. Since NH$_3$ is 7 ppb, the humidity within the cleanroom is set as 17% (normally 45%).

<Second Example>

A second example is a case where the first resist material of a 2-component type which consists of the following is used:

| | |
|---|---|
| Resin which is made alkali-soluble by acid . . . poly ((1-ethoxy)ethoxystyrene) (35 mol %) - hydroxystyrene (65 mol %) | 10 g |
| Compound which generates acid when under an energy ray (acid generating agent) . . . 2, 6-dinitrobenzyltosylate | 0.5 g |
| Solvent . . . propyleneglycol mononethyletheracetate | 45 g |

Figure 10:
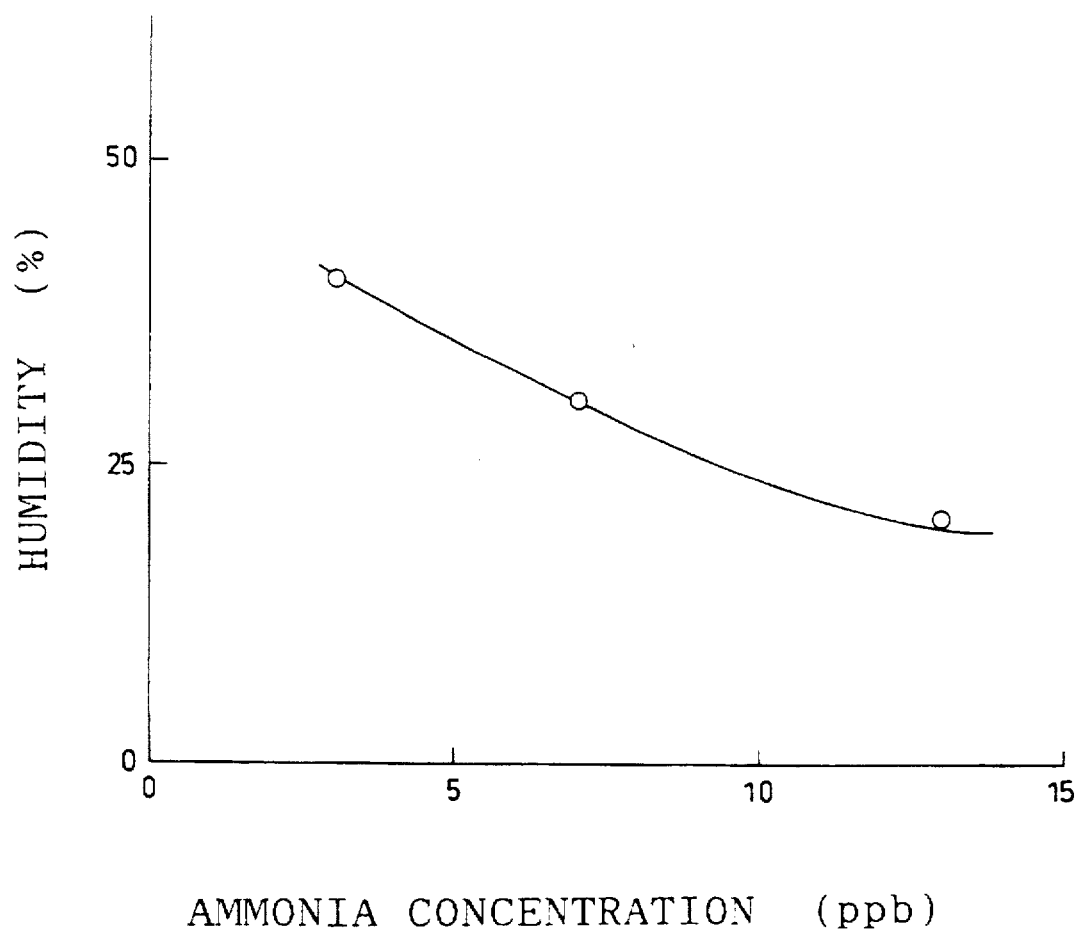
FIG. 10 is a characteristic diagram showing a correlation between an impurity concentration within an environment which produces an excellent pattern profile and the humidity within the environment, in a second example of the pattern forming method according to the second preferred embodiment.

First, as shown in FIG. 10, a relationship is found between the concentration of ammonia (ppb) and a humidity at which a resist pattern having an excellent profile can be formed. At the same time, the concentration of NH$_3$ within the cleanroom is measured and the humidity within the cleanroom is set at such a value at which a resist pattern having an excellent profile can be formed.

<Third Example>

A third example is a case where the first resist material of a 3-component type which consists of the following is used:

| | |
|---|---|
| Alkali-soluble resin . . . poly (vinylphenol) | 10 g |
| Compound which prevents alkaline dissolution of an alkali-soluble resin and which is made alkali-soluble by acid . . . tert-butyloxycarbonyloxybisphenol A | 1.5 g |
| Compound which generates acid when under an energy ray (acid generating agent) . . . triphenylsulfoniumtriflate | 0.5 g |
| Solvent . . . diethyleneglycol dimethylether | 50 g |

First, as shown in FIG. 11, a relationship is found between the concentration of ammonia (ppb) and a humidity at which a resist pattern having an excellent profile can be formed. At the same time, the concentration of NH$_3$ within the cleanroom is measured and the humidity within the cleanroom is set at such a value at which a resist pattern having an excellent profile can be formed.

<Fourth Example>

A fourth example is a case where a second resist material of a 3-component type which consists of the following is used:

| | |
|---|---|
| Alkali-soluble resin . . . poly (vinylphenol) | 10 g |
| Compound which prevents alkaline dissolution of an alkali-soluble resin and which is made alkali-soluble by acid (1-ethoxy)ethoxybisphenol A | 2.0 g |
| Compound which generates acid when under an energy ray (acid generating agent) . . . 2, 6-dinitrobenzyltosylate | 0.5 g |
| Solvent . . . propyleneglycol monomethyletheracetate | 50 g |

Figure 12:
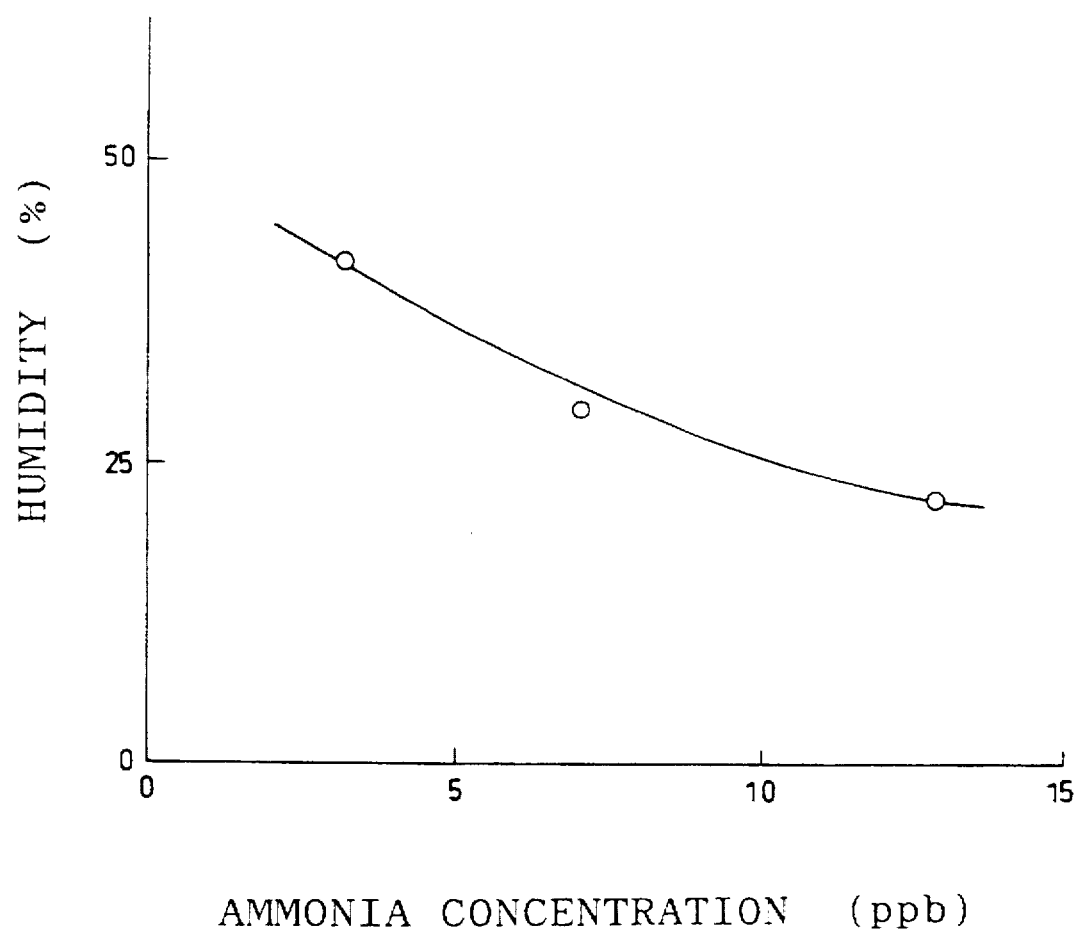
FIG. 12 is a characteristic diagram showing a correlation between an impurity concentration within an environment which produces an excellent pattern profile and the humidity within the environment, in the second example of the pattern forming method according to the fourth preferred embodiment.
Figure 13A:
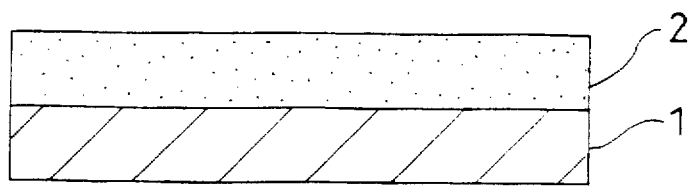
FIGS. 13A to 13D are cross sectional views for describing the respective steps of a conventional pattern forming method.
Figure 13B:
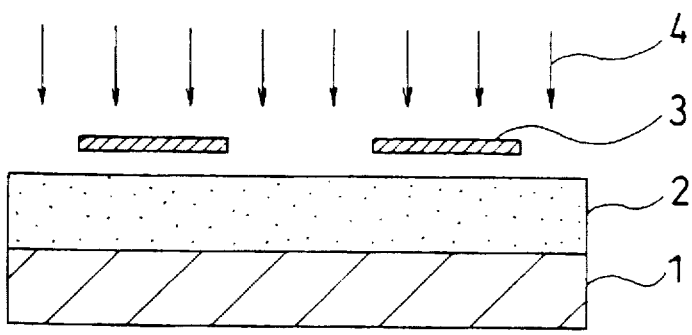
Figure 13C:
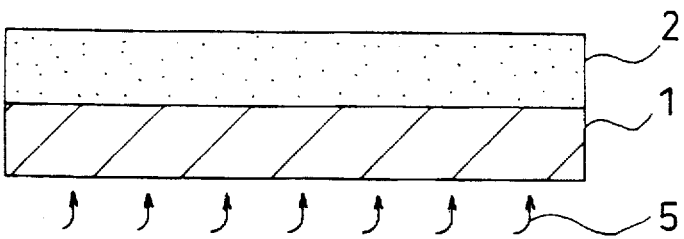
Figure 13D:
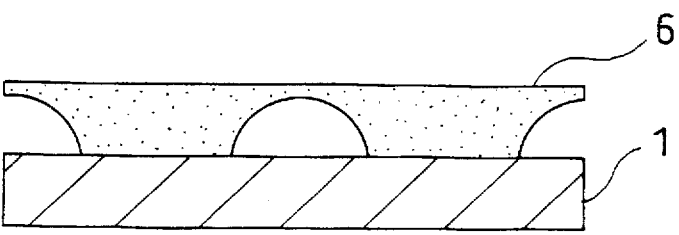

First, as shown in FIG. 12, a relationship is found between the concentration of ammonia (ppb) and a humidity at which a resist pattern having an excellent profile can be formed. At the same time, the concentration of NH$_3$ within the cleanroom is measured and the humidity within the cleanroom is set at such a value at which a resist pattern having an excellent profile can be formed.

While the foregoing has described the first and the second preferred embodiments in relation to a case where a chemically amplified resist of a positive type is used, the present invention is also applicable to a case where a chemically amplified resist of a negative type is used and a case where a positive or a negative resist is used.

The energy ray may be a ultraviolet ray, a far ultraviolet ray, excimer laser light, an electron ray, an X-ray, etc.

The compound which generates acid when under an energy ray may be onium suit, a sulfonic acid compound, a carboxylic acid compound, a triazine compound, etc.

The resin which is contained in the 2-component type resist material and which is made alkali-soluble by acid may be polyvinylphenol, a copolymer of polyvinylphenol, a novolac resin, a copolymer of a novolac resin, a resin which is formed by each one of these materials and a protective group, etc. The protective group may be a tert-butyl group, a tert-butyl oxycarbonyl group, a tetrahydropyranyl group, an acetal group, a ketal group, a trimethysilyl group, etc.

The alkali-soluble resin which is contained in the 3-component type resist material may be polyvinylphenol, a copolymer of polyvinylphenol, a novolac resin, a copolymer of a novolac resin, etc. The compound which prevents alkaline dissolution of an alkali-soluble resin and which is made alkali-soluble by acid may be an alkali-soluble compound as it is protected with a tert-butyl group, a tert-butyloxycarbonyl group, a tetrahydropyranyl group, an acetal group, a ketal group, a trimethysilyl group, etc.

The foregoing has described the first and the second preferred embodiments in relation to a case where an impurity which deactivates acid is ammonia. However, in addition to ammonia, the impurity which deactivates acid may be amine. Any amine, water-soluble or not, can be quantified by NH$_3$ conversion using a chemiluminescent method. Except for amine, the impurity which deactivates acid may be a substance containing a sulfuric acid ion or an nitric acid ion, etc.

Further, although a resist film is heated before developed to diffuse acid which is generated by the acid generating agent according to the first and the second preferred embodiments, the resist film may not be heated.

What is claimed is:

1. A method for forming a pattern, comprising: a first step of setting the humidity in an environment for forming a resist pattern at a low level when the profile of the resist pattern tends to be a T-top profile as compared with a reference pattern profile but setting the humidity at a high level when the profile of the resist pattern tends to be a round-shoulder profile as compared with the reference pattern profile;

a second step of forming a resist film by coating a substrate with a resist;

a third step of exposing said resist film through a mask in an environment with the humidity set at said first step; and a fourth step of developing said resist film which is exposed to thereby form a resist pattern.

2. A method for forming a pattern, comprising:

a first step of setting the humidity in an environment for forming a resist pattern at a low level when an impurity concentration within the environment for forming a resist pattern is larger than a predetermined value but setting the humidity at a high level when the impurity concentration within the environment for forming a resist pattern is smaller than the predetermined value;

a second step of forming a resist film by coating a substrate with a resist;

a third step of exposing the resist film through a mask within the environment with the humidity set at the first step; and a fourth step of developing the exposed resist film to thereby form a resist pattern.

3. The method for forming a pattern of claim 2, wherein said resist is a chemically amplified resist of a 2-component type or a 3-component type which includes an acid generating agent which generates acid when irradiated with an energy ray and a compound which is made alkali-soluble by acid, and said impurity is ammonia.

* * * * *